(12) United States Patent
Annapragada et al.

(10) Patent No.: US 6,255,210 B1
(45) Date of Patent: Jul. 3, 2001

(54) SEMICONDUCTOR DIELECTRIC STRUCTURE AND METHOD FOR MAKING THE SAME

(75) Inventors: Rao V. Annapragada; Milind G. Weling, both of San Jose, CA (US)

(73) Assignee: Philips Electronics North America Corp., New York, NY (US)

( * ) Notice: Subject to any disclaimer, the term of this patent is extended or adjusted under 35 U.S.C. 154(b) by 0 days.

(21) Appl. No.: 09/344,641

(22) Filed: Jun. 25, 1999

(51) Int. Cl.[7] .................................... H01L 21/4763
(52) U.S. Cl. .................. 438/624; 438/778; 438/788; 427/255.18; 427/255.28
(58) Field of Search .................................... 438/626, 624, 438/631, 778, 787, 788; 427/255.28, 255.23, 255.18

(56) References Cited

U.S. PATENT DOCUMENTS

| | | | |
|---|---|---|---|
| 4,732,761 | 3/1988 | Machida et al. | 438/695 |
| 5,679,606 | 10/1997 | Wang et al. | 438/763 |
| 5,723,386 | 3/1998 | Ishikawa | 438/787 |
| 6,030,881 | * 2/2000 | Papsouliotis et al. | 438/424 |

* cited by examiner

Primary Examiner—Caridad Everhart
(74) Attorney, Agent, or Firm—Martine & Penilla, LLP

(57) ABSTRACT

A method for fabricating inter-metal oxide in semiconductor devices and semiconductor devices is provided. The method begins by providing a semiconductor substrate having a plurality of patterned conductive features. The method then moves to where a high density plasma (HDP) operation is performed and is configured to deposit an oxide layer over the plurality of patterned conductive features. The HDP operation includes a deposition component and a sputtering component. The deposition component is driven by a deposition gas and the sputtering component is driven by a sputtering gas. The HDP operation forms oxide pyramids over the plurality of patterned conductive features. The method now moves to where the deposition gas is removed to close off the deposition component in the HDP operation. Now, the HDP operation is run with the sputtering gas while retaining the sputtering component. The sputtering component is configured to substantially remove the oxide pyramids from over the plurality of patterned conductive features. Preferably, the plurality of patterned conductive features are either patterned metallization features or patterned polysilicon features.

18 Claims, 10 Drawing Sheets

SEMICONDUCTOR DIELECTRIC STRUCTURE AND METHOD FOR MAKING THE SAME

BACKGROUND OF THE INVENTION

1. Field of the Invention

The present invention relates to semiconductor devices, and more particularly, to the formation of oxide layers to be used between conductive features designed on multiple levels of a semiconductor device.

2. Description of the Related Art

As the demand for faster, smaller, and more densely packed integrated circuit designs continues to increase, design engineers are faced with a greater burden of designing high performance chips at a reasonable cost. Although conventional methods of chip fabrication can be performed at a reasonable cost, they have noticeable limitations as chip dimensions steadily decrease. To illustrate some of the conventional fabrication methods and their associated limitations, reference is now drawn to FIGS. 1A through 1E.

FIG. 1A shows a cross-sectional view of a conventional chip fabrication process where patterned conductive features 12 are fabricated over a semiconductor substrate 10. The patterned conductive features 12 are typically polysilicon gate lines or metal lines. A conventional high density plasma (HDP) oxide 14 is used to fill the gaps between the patterned conductive features 12. The reason for using a conventional HDP oxide 14 is to fill the high aspect ratio gaps. Although conventional HDP oxide 14 works well in filling these gaps, the HDP operation itself causes the formation of oxide pyramids 15 over the patterned conductive features 12. Plasma enhanced chemical vapor deposition (PECVD) oxide 16 is then deposited over the layer of HDP oxide 14. As a result of having the oxide pyramids 15 on top of the patterned conductive features 12, low density oxide seams 18 are created during the formation of the PECVD oxide 16. In general, the low density oxide seams 18 have a slightly less dense characteristic relative to the bulk of the PECVD oxide 16.

FIG. 1B shows the conventional fabrication process of FIG. 1A after an oxide chemical mechanical polishing (CMP) operation has been used to planarize the top surface of the PECVD oxide 16. Unfortunately, indentations 20 are created on the surface of the PECVD oxide 16 due to the low density oxide seams 18. More specifically, because the oxide seams 18 have a less dense characteristic, the chemical used during the CMP operation tends to remove more of this oxide material.

FIG. 1C shows a continuation of the conventional fabrication process of FIG. 1B. A via hole 23 is etched down to a portion of the patterned conductive features 12a. It can be appreciate that via hole 23 is merely for illustration purposes, as thousands or millions of via holes are typically etched at any given interconnect layer. In order to begin filling the via hole, a Titanium (Ti)/Titanium Nitride (TiN) layer 22 is deposited over the wafer. The Ti/TiN layer 22 provides a first layer of conductive material in the via hole 23 (e.g., acts as a glue layer). This requires that the material be deposited over the entire surface of the wafer. In order to finish filling the via hole 23, a tungsten (W) layer 24 is deposited over the wafer. The W layer 24, thereby, fills the via hole 23 and establishes a conductive via. As shown, the entire wafer surface is coated with conductive material. Unfortunately, the Ti/TiN layer 22 and the W layer 24 also fill the indentations 20 created during the CMP due to the low density oxide seams 18.

FIG. 1D shows a continuation of the conventional fabrication process of FIG. 1C. The top surface has undergone a tungsten chemical mechanical polishing (CMP) in order to smooth the surface and polish away the Ti/TiN layer 22 and the W layer 24. The goal of the tungsten CMP is to leave the top surface of the PECVD oxide 16 layer free of conductive material and expose the metal material of the conductive vias. Unfortunately, after the tungsten CMP, conductive stringers 26 remain due to the Ti/TiN layer 22 and the W layer 24 that filled the indentations 20. As discussed above with reference to FIG. 1C, the indentations 20 are created due to the low density oxide seams 18. Notice that the conductive stringers 26 may extend along the top surface of the wafer.

FIG. 1E shows a continuation of the conventional fabrication process of FIG. 1D. Patterned metallization features 30a and 30b are formed by first depositing a blanket metallization material and then performing conventional photolithography patterning. Because metallization interconnect lines are patterned in many different geometric shapes throughout a layer to complete desired electrical interconnections, the patterned metallization features 30a and 30b may pass over the conductive stringers 26, as shown in FIG. 1E. The problem is that the conductive stringers 26, which are flaws in the fabrication process, cause inappropriate conductive interaction between the patterned metallization features 30a and 30b. When this happens, the functionality of a given integrated circuit design may fail to produce the desired response. As a result, the entire integrated circuit may have to be discarded, which adds a significant amount of cost to the fabrication process and lowers throughput.

In view of the foregoing, what is needed is a method for fabricating integrated circuit designs that avoid the creation of unwanted stringers 26, which cause short circuits and inappropriate electrical responses. There is also a need for an integrated circuit design, which is fabricated to avoid introducing the aforementioned stringers 26.

SUMMARY OF THE INVENTION

Broadly speaking, the present invention fills these needs by providing methods and resulting dielectric layers that avoid the problems of the prior art. It should be appreciated that the present invention can be implemented in numerous ways, including as a process, an apparatus, a system, a device, or a method. Several inventive embodiments of the present invention are described below.

In one embodiment, a method for fabricating inter-metal oxide in semiconductor devices is disclosed. The method begins by providing a semiconductor substrate having a plurality of patterned conductive features. The method then moves to where a high density plasma (HDP) operation is performed and is configured to deposit an oxide layer over the plurality of patterned conductive features. The HDP operation includes a deposition component and a sputtering component. The deposition component is driven by a deposition gas, and the sputtering component is driven by a sputtering gas. The HDP operation forms oxide pyramids over the plurality of patterned conductive features. The method now moves to where the deposition gas is removed to close off the deposition component in the HDP operation. Now, the HDP operation is run with the sputtering gas that retains the sputtering component active. The sputtering component is configured to substantially remove the oxide pyramids from over the plurality of patterned conductive features. Preferably, the plurality of patterned conductive features are either patterned metallization features or patterned polysilicon features.

In another embodiment, a semiconductor device including a semiconductor substrate having a plurality of patterned conductive features is disclosed. The semiconductor device has an oxide layer having suppressed oxide pyramids defined over the plurality of patterned conductive features. The oxide layer is defined by a high density plasma (HDP) operation. The HDP operation includes a deposition component and a sputtering component. The deposition component is driven by a deposition gas. The sputtering component is driven by a sputtering gas. The deposition and sputtering components are performed together during a first part of the formation of the oxide layer. The deposition component is not performed during a second part of the formation of the oxide layer.

In still another embodiment, a method for fabricating inter-metal oxide in semiconductor integrated circuit devices is disclosed. The method begins by providing a semiconductor substrate having a plurality of patterned conductive features, where some of the patterned conductive features define high aspect ratio gaps. The method moves to starting a high density plasma (HDP) operation that is configured to deposit an oxide layer over the plurality of patterned conductive features and in the high aspect ratio gaps. The HDP operation includes a deposition component and a sputtering component. The deposition component is driven by a deposition gas, and the sputtering component is driven by a sputtering gas. The HDP operation forms oxide pyramids over the plurality of patterned conductive features. The method then moves to continuing the HDP operation without the deposition gas in order to remove the deposition component while retaining the sputtering component. The HDP operation is complete when the oxide pyramids are substantially smoothed.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for methods and resulting integrated circuit structures having reliable inter-metal dielectric layers is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to obscure the present invention.

Figure 1A:
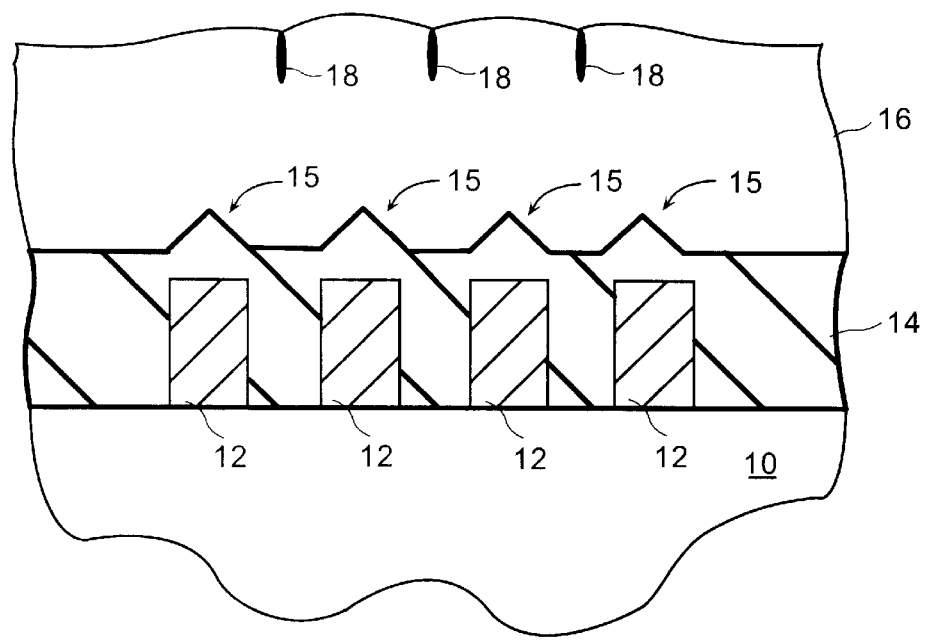
FIG. 1A shows a cross-sectional view of a conventional chip fabrication process where patterned conductive features are fabricated over a semiconductor substrate.
Figure 1B:
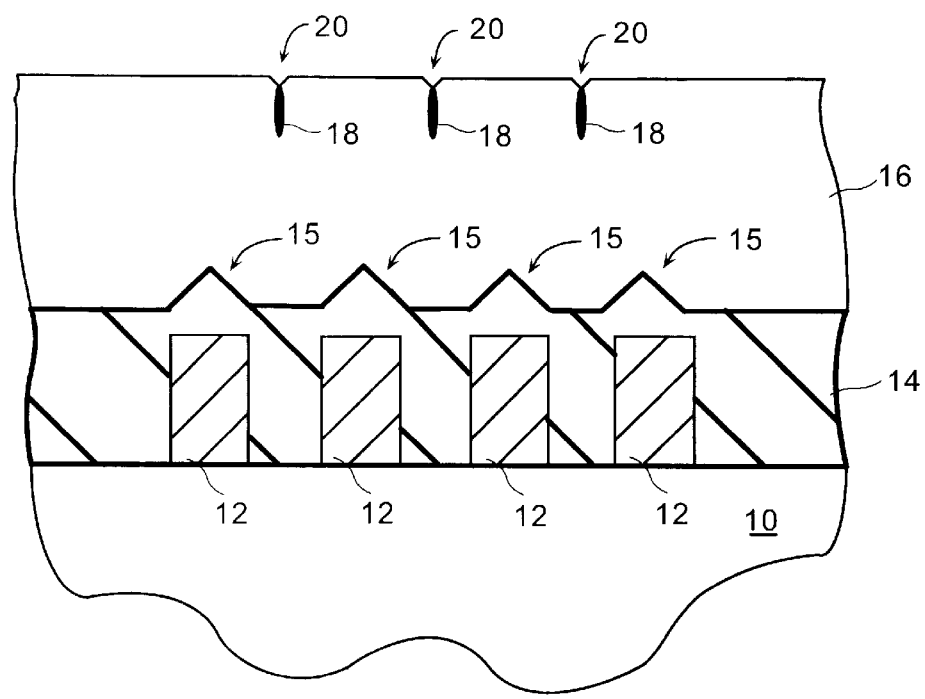
FIG. 1B shows the conventional fabrication process of FIG. 1A after an oxide chemical mechanical polishing (CMP) operation has been used to planarize the top surface of the PECVD oxide.
Figure 1C:
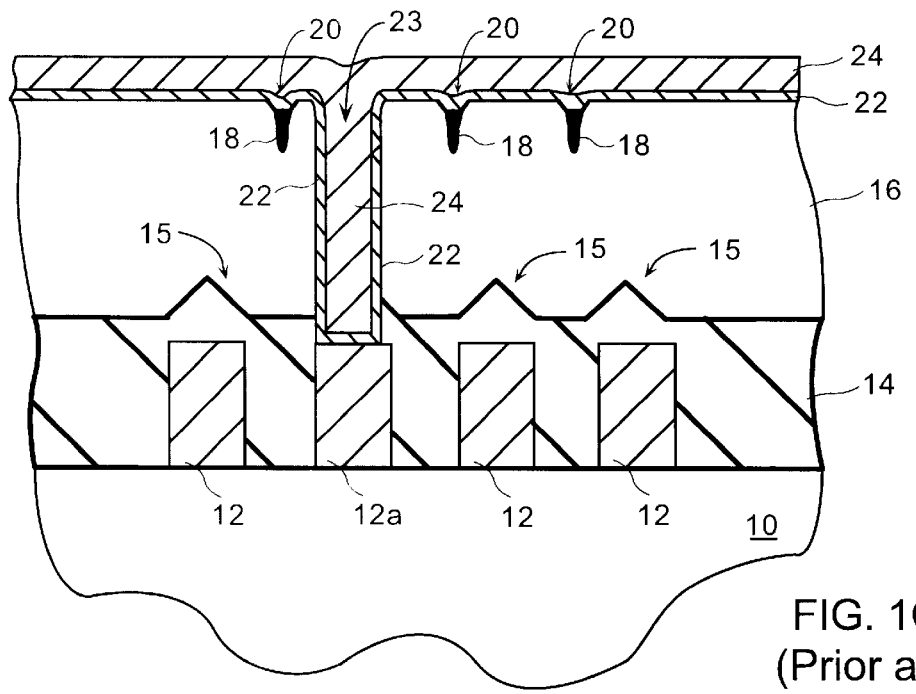
FIG. 1C shows a continuation of the conventional fabrication process of FIG. 1B after a via hole is etched down to a portion of the patterned conductive features.
Figure 1D:
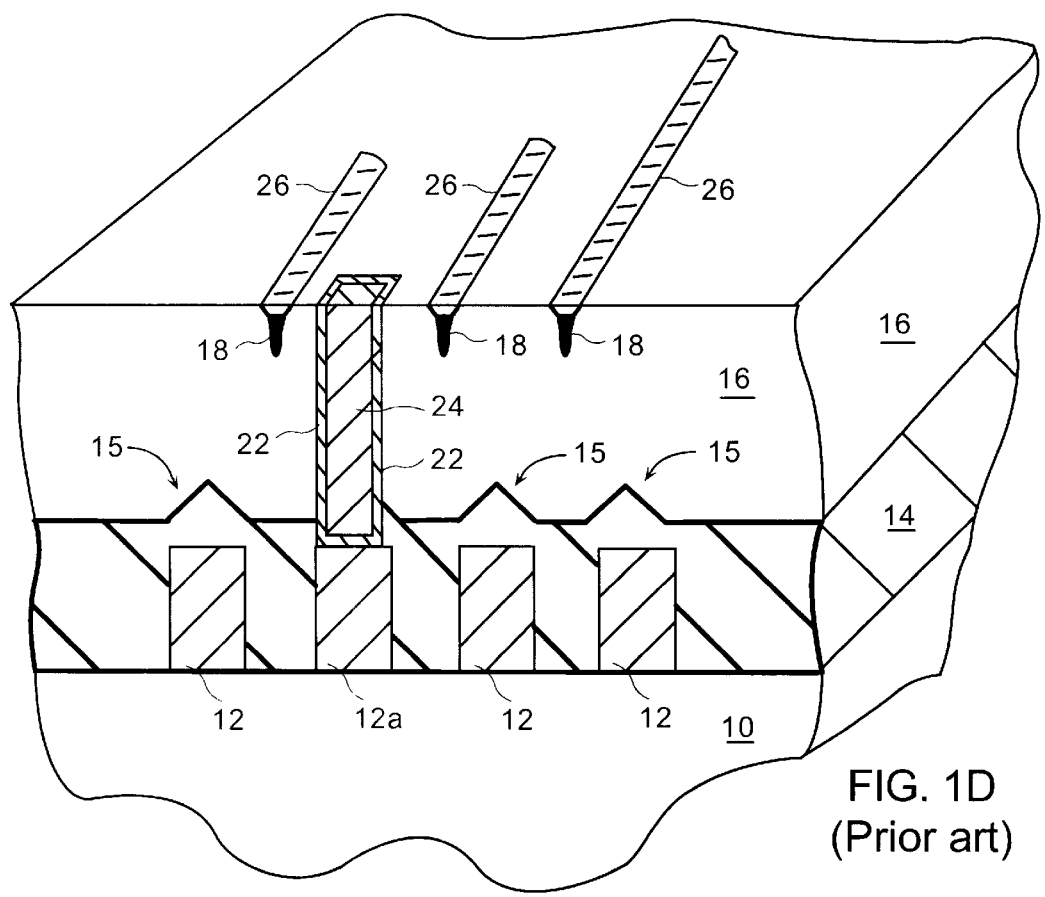
FIG. 1D shows a continuation of the conventional fabrication process of FIG. 1C after the top surface has undergone a tungsten chemical mechanical polishing (CMP).
Figure 1E:
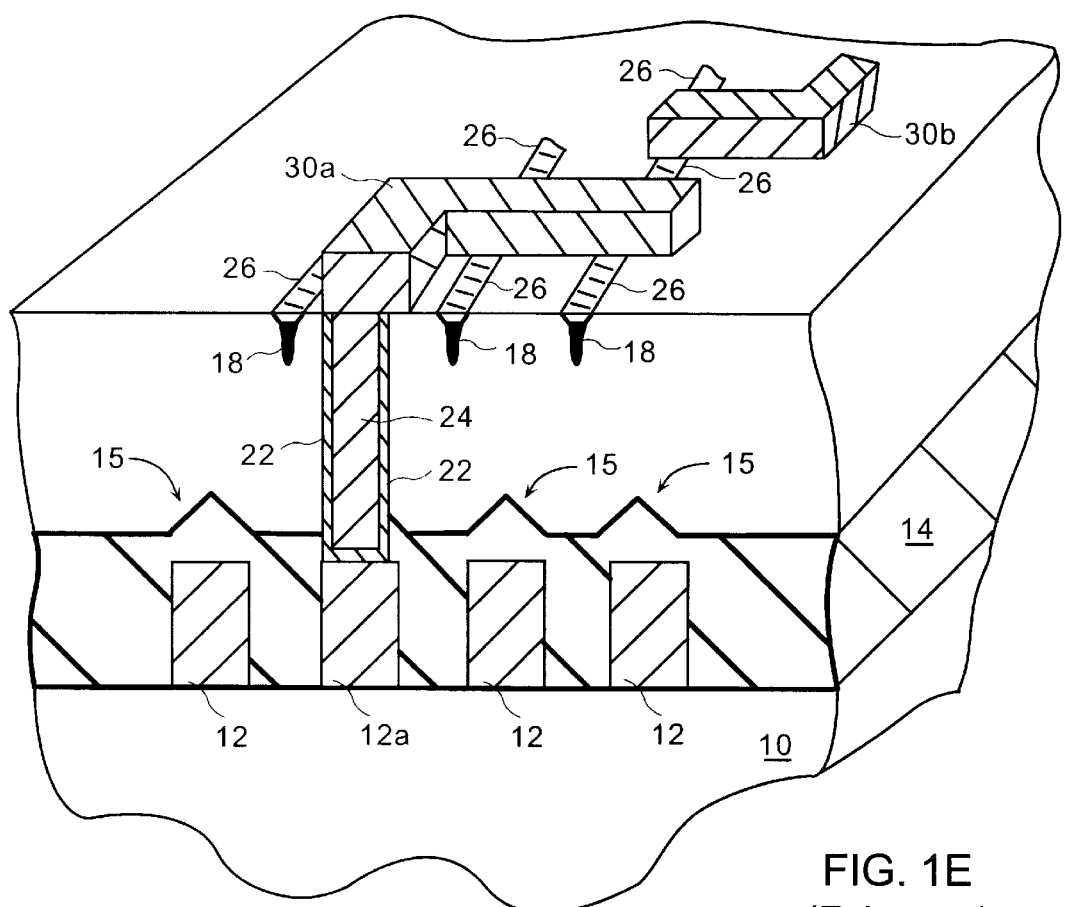
FIG. 1E shows a continuation of the conventional fabrication process of FIG. 1D after patterned metallization features are formed over the top surface.
Figure 2A:
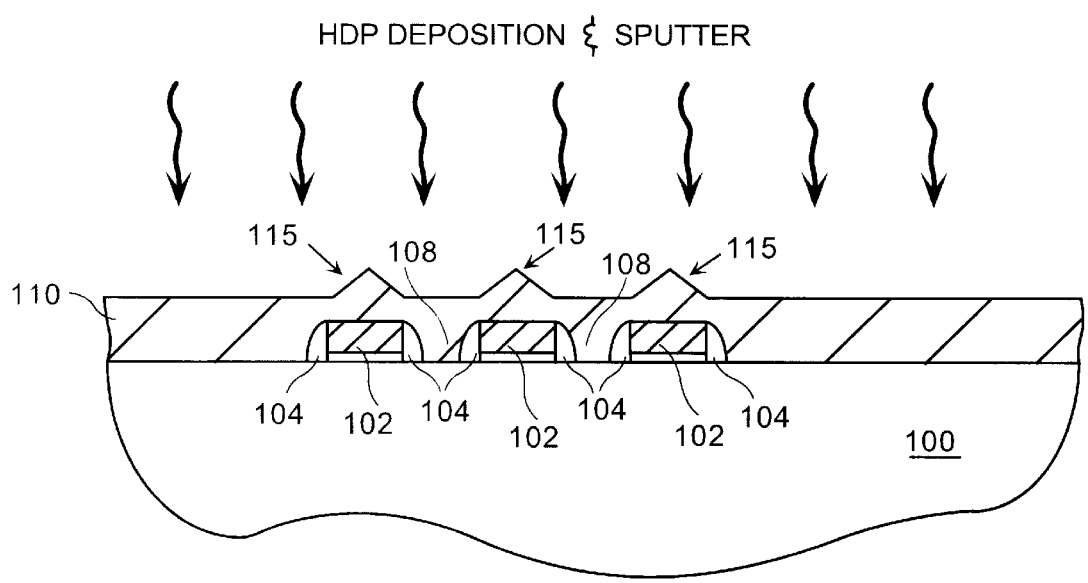
FIG. 2A shows a cross-sectional view of an integrated circuit chip fabrication process after an HDP deposition and sputter operation.

FIG. 2A shows a cross-sectional view of an integrated circuit chip fabrication process after an HDP deposition and sputter operation. Patterned conductive features are fabricated over a semiconductor substrate 100, which is preferably a wafer of about 8 inches in diameter. As shown in FIG. 2A, the patterned conductive features may be patterned polysilicon features 102 that function as polysilicon gates and have oxide spacers 104. On subsequent layers, patterned conductive features are typically formed to make a metallization interconnect network, and are respectively insulated between layers by inter-metal oxides. Using a high density plasma (HDP) operation, a first HDP oxide 110 is deposited over the polysilicon features 102 and is configured to fill the gaps 108 between the oxide spacers 104. As is well known, the HDP operation is preferred over other oxide deposition techniques due to its ability to completely fill high aspect ratio regions, without forming voids.

The HDP operation is run in a process chamber and is known to have a deposition component and a sputter component. An Ultima HDP Chamber™ by Applied Materials is an example of a suitable HDP process chamber. The deposition component of the HDP operation is driven by a deposition gas, which preferably includes a silane gas. The silane gas combined with oxygen and other gases and proper deposition conditions provides for the deposition of silicon dioxide ($SiO_2$), by way of the HDP operation. The silicon dioxide may be undoped or may be doped (e.g., with phosphorous or fluorine). The rate at which the silane gas is introduced into the process chamber is preferably set at about 75 sccm. The flow rate of the oxygen gas is preferably set to be between about 120 sccm and about 180 sccm, and most preferably about 150 sccm. The sputtering component of the HDP operation is driven by a sputtering gas, which preferably includes an argon gas. The argon gas flow rate is preferably set to be between about 100 sccm and about 120 sccm, and most preferably about 110 sccm.

The pressure conditions of the HDP operation are preferably set to be between about 3 mTorr and about 10 mTorr, and most preferably about 5 mTorr. The bottom power of the chamber is preferably set to be between about 500 Watts and 4500 Watts, and most preferably about 3500 Watts. The top power of the chamber is preferably set to be between about 600 Watts and 2000 Watts, and most preferably about 1300 Watts. The side power of the chamber is preferably set to be between about 1000 Watts and 4500 Watts, and most preferably about 3100 Watts.

In FIG. 2A, although the first HDP oxide 110 works well to fill in the gaps 108, the HDP operation itself causes the formation of oxide pyramids 115 over the polysilicon gates 102. During the HDP operation, the oxide pyramids 115 may be formed having varying heights depending upon the underlying features and the thickness of the applied oxide. In some cases, the oxide pyramids 115 may have peak heights ranging between about 500 angstroms and about 2,500 angstroms. In a more typical case, the peak heights may be about 1000 angstroms.

In accordance with one embodiment of the present invention, it is desired that the oxide pyramids 115 be substantially removed to avoid the formation of the seams 18, which were discussed with reference to FIGS. 1A through 1D. To achieve this goal, the HDP deposition gas is closed after the first HDP oxide 110 is formed to a desired thickness and the gaps 108 are filled. The closing at this point, thereby causes the deposition component to be removed from the HDP operation.

Figure 2B:
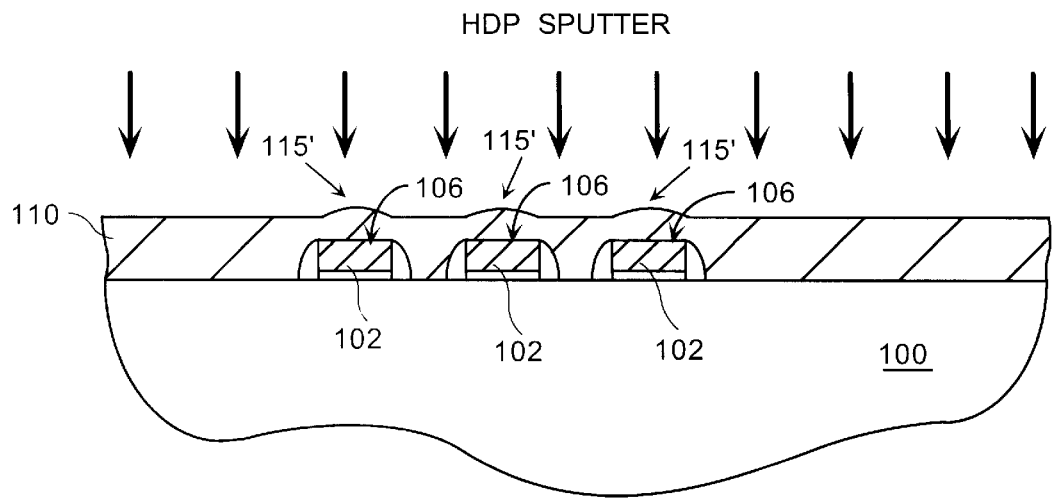
FIG. 2B shows a cross-sectional view of the integrated circuit chip fabrication process of FIG. 2A after the HDP deposition component has been removed for a period of time, in accordance with one embodiment of the present invention.

FIG. 2B shows a cross-sectional view of the integrated circuit chip fabrication process of FIG. 2A after the HDP deposition gas has been closed for a period of time. For example, the HDP operation is run with only the sputtering component in order to substantially remove the oxide pyramids 115 from over the polysilicon gates 102. In order to remove peak heights ranging between about 500 angstroms and about 2,500 angstroms, the sputtering component is run for a time ranging between about 10 seconds and about 45 seconds, respectively. For a more typical peak height of about 1000 angstroms, the sputtering component is preferably run for about 20 seconds. It should be understood that these timing ranges are only exemplary, and modifications may be made depending upon the specific process conditions of a particular process setup.

Figure 2C:
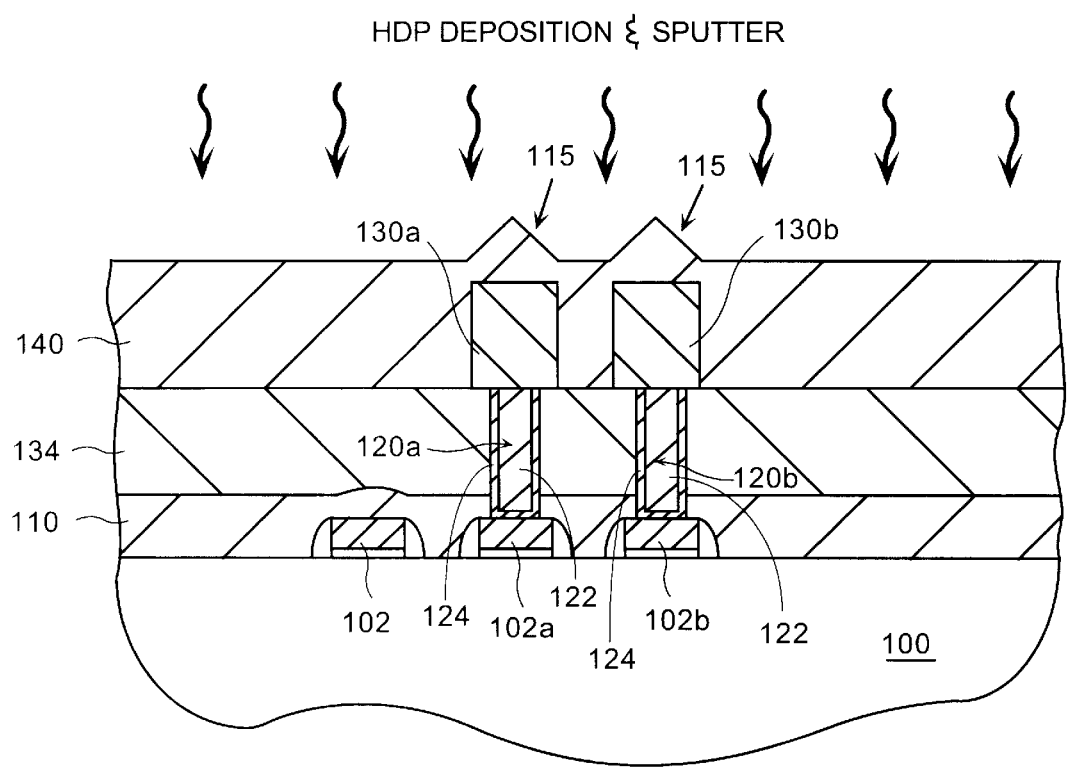
FIG. 2C shows a cross-sectional view of a continuation of the integrated circuit chip fabrication process of FIG. 2B after a PECVD oxide layer is deposited and oxide pyramids are formed over the top surface.

FIG. 2C shows a cross-sectional view of a continuation of the integrated circuit chip fabrication process of FIG. 2B, in accordance with one embodiment of the present invention. A first PECVD oxide 134 is deposited over the top surface of the HDP oxide 110, after the HDP sputter is performed to substantially remove the oxide pyramids 115 thus leaving suppressed oxide pyramids 115'. After the PECVD oxide 134 is deposited, the wafer is placed through an oxide CMP operation. Via holes are then etched down to the surface of the polysilicon gates 102a and 102b and filled with conductive material to establish conductive contacts 120a and 120b. The conductive contacts 120 are preferably coated with Ti/TiN layers 124, and filled with a W layer 122. A tungsten chemical mechanical polishing (CMP) operation is then used to planarize the top surface of the first PECVD oxide 134, and remove the excess metallization used to fill the via holes. A metallization layer is then formed over the first PECVD oxide 134 and the conductive contacts 120a and 120b. Using metal deposition, photolithography and etching techniques, patterned metallization features 130a and 130b are created over the top surface. A second HDP oxide 140 is then deposited and sputtered over the top surface of the first PECVD oxide 134 and the patterned metallization features 130. As shown in FIG. 2C, the HDP operation again causes the formation of oxide pyramids 115 over the patterned metallization features 130.

As discussed with reference to FIGS. 2A and 2B, it is desired that the oxide pyramids 115 be substantially removed to avoid the formation of the seams 18, which were discussed with reference to FIGS. 1A through 1D. The HDP sputter process that was used to smooth the oxide pyramids 115 of FIG. 2A is again used to smooth the oxide pyramids 115 of FIG. 2C. The HDP sputter process forms suppressed oxide pyramids 115', as shown in FIG. 2D.

This process of performing the HDP deposition and sputter operation and then closing the deposition component may be repeated for subsequent HDP oxide layers. FIGS. 2E and 2F illustrate this reiteration process.

Figure 2D:
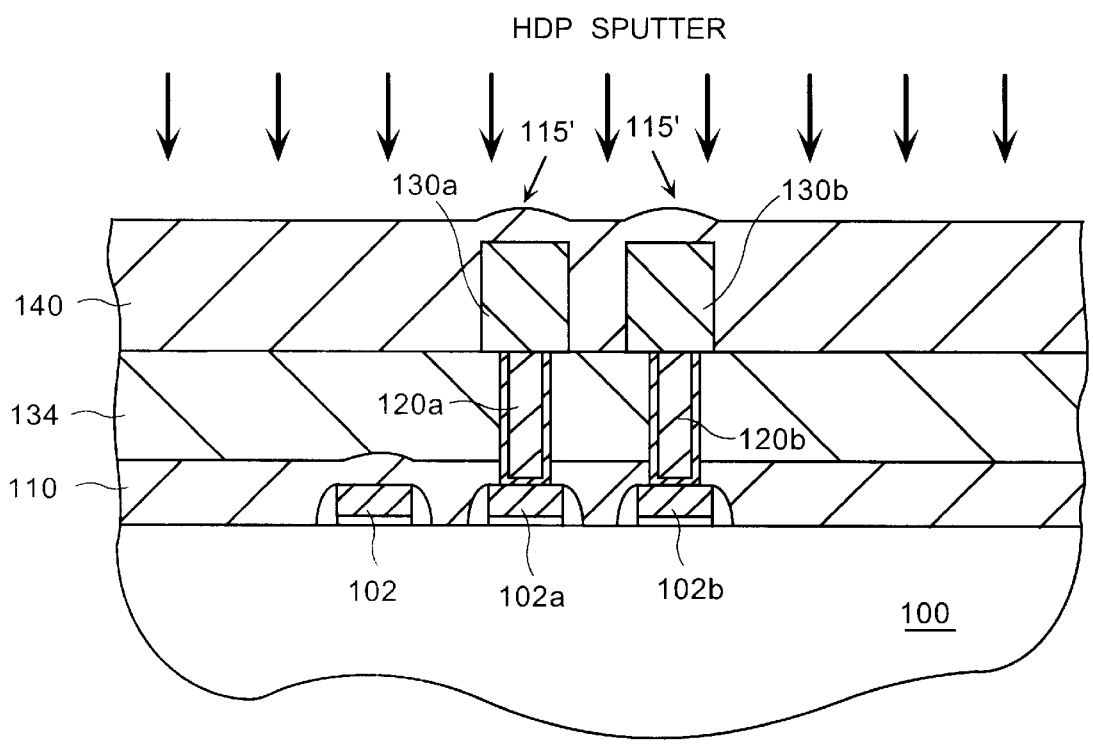
FIG. 2D shows a cross-sectional view of a continuation of the integrated circuit ship fabrication process of FIG. 2C after the HDP sputter process forms suppressed oxide pyramids, in accordance with one embodiment of the present invention.
Figure 2E:
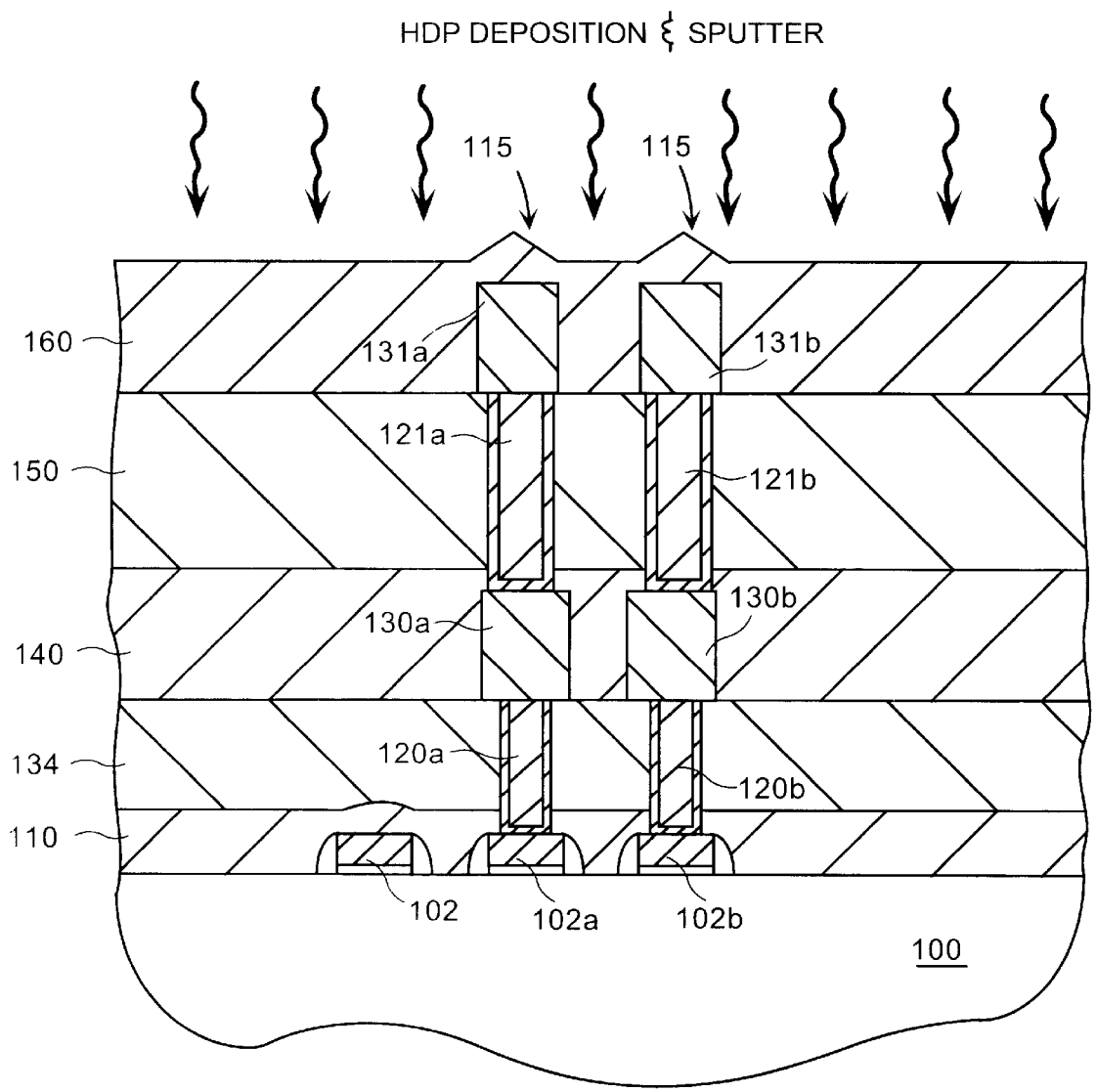
FIG. 2E shows a cross-sectional view of a continuation of the integrated circuit chip fabrication process of FIG. 2D after a second PECVD oxide is deposited over the top surface of the second HDP oxide and oxide pyramids are formed on the top surface.
Figure 2F:
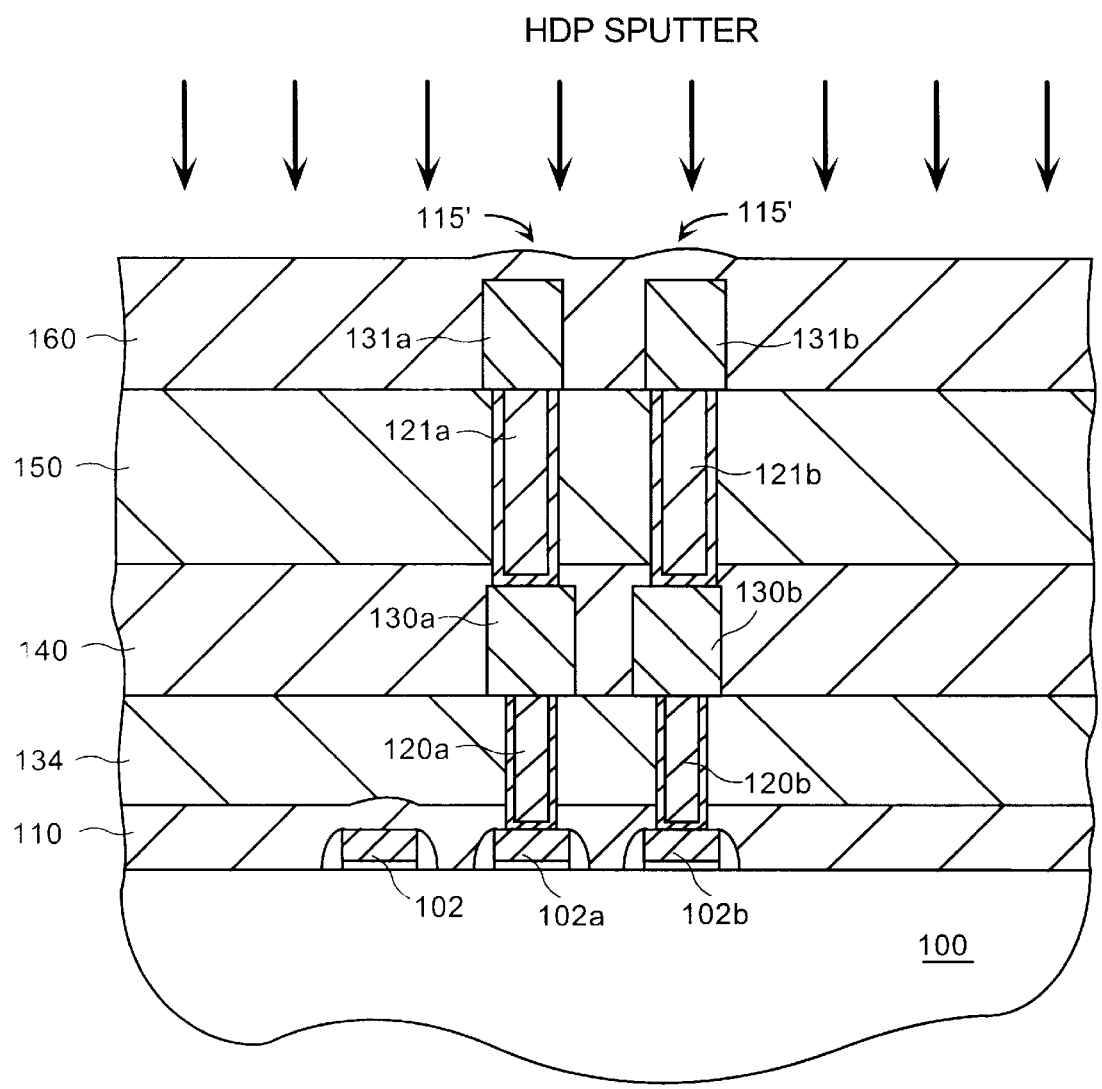
FIG. 2F shows a cross-sectional view of a continuation of the integrated circuit chip fabrication process of FIG. 2E after the oxide pyramids have been suppressed, in accordance with one embodiment of the present invention.

FIG. 2E shows a cross-sectional view of a continuation of the integrated circuit chip fabrication process of FIG. 2D, in accordance with one embodiment of the present invention. A second PECVD oxide 150 is deposited over the top surface of the second HDP oxide 140, after the HDP sputter is performed to substantially remove the oxide pyramids 115, thus, leaving suppressed oxide pyramids 115'. After the second PECVD oxide 150 is deposited, the wafer is placed through an oxide CMP operation. Via holes are then etched down to the surface of the patterned metallization features 130a and 130b and filled with conductive material to establish conductive vias 121a and 121b. The conductive vias 121 are preferably coated with Ti/TiN layers, and filled with a W layer. As in the discussion with reference to FIG. 2C, a tungsten CMP operation is then used to planarize the top surface down to the second PECVD oxide 150 and remove the excess metallization used to fill the via holes. A metallization layer is then formed over the second PECVD oxide 150 and the conductive vias 121a and 121b. Using metal deposition, photolithography and etching techniques, patterned metallization features 131a and 131b are formed over the top surface. A third HDP oxide 160 is then deposited and sputtered over the top surface of the second PECVD oxide 150 and the patterned metallization features 131. As shown in FIG. 2E, the HDP operation once again causes the formation of oxide pyramids 115 over the patterned metallization features 131.

As discussed with reference to FIGS. 2A and 2B, it is desired that the oxide pyramids 115 be substantially removed to avoid the formation of the seams 18. The HDP sputter process that was used to smooth the oxide pyramids 115 of FIG. 2A is again used to smooth the oxide pyramids 115 of FIG. 2E. The HDP sputter process therefore forms suppressed oxide pyramids 115', as shown in FIG. 2F.

Figure 3A:
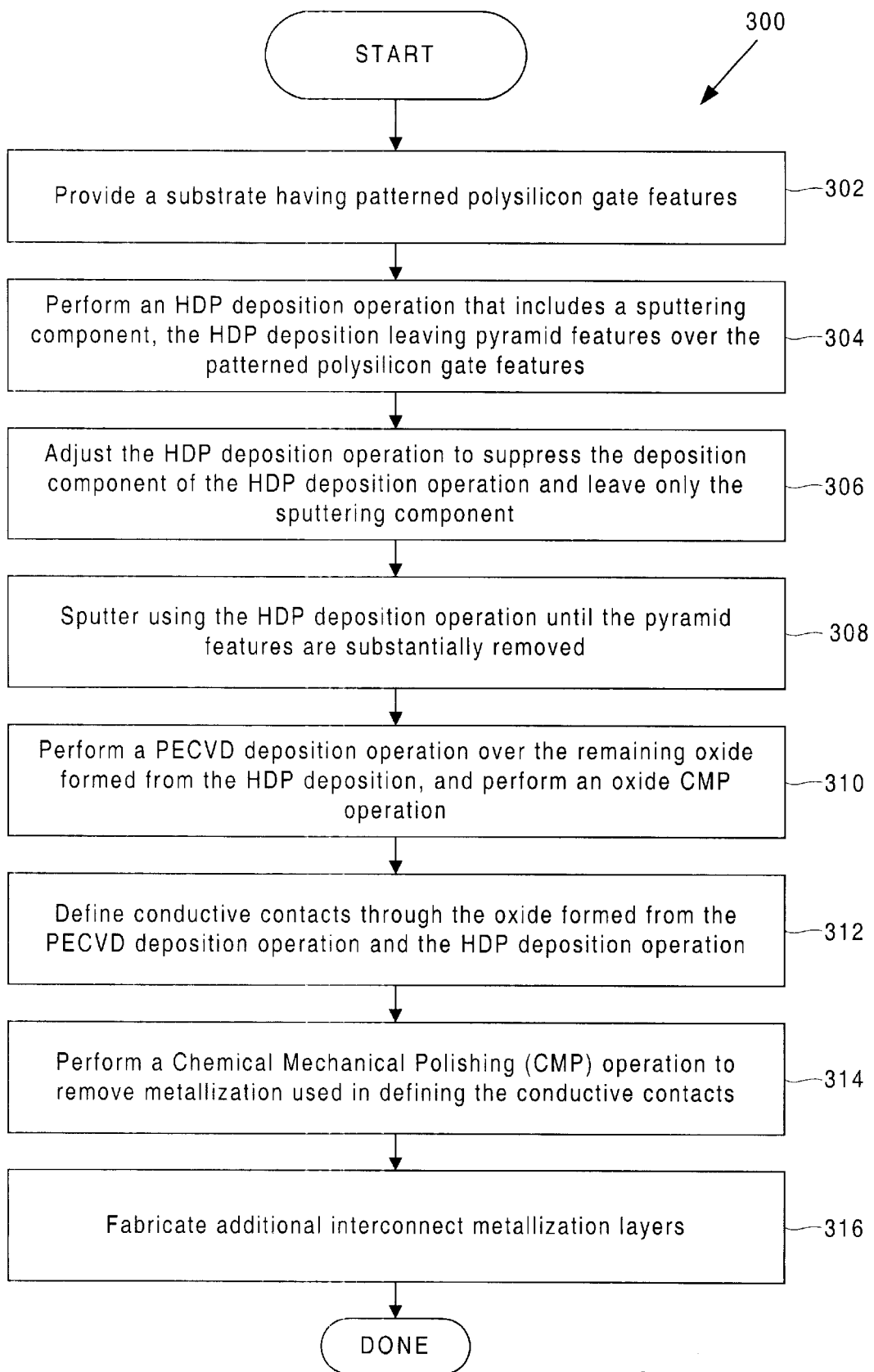
FIG. 3A shows the method operations implemented to form reliable HDP oxide over a layer of patterned polysilicon, in accordance with one embodiment of the present invention.
Figure 3B:
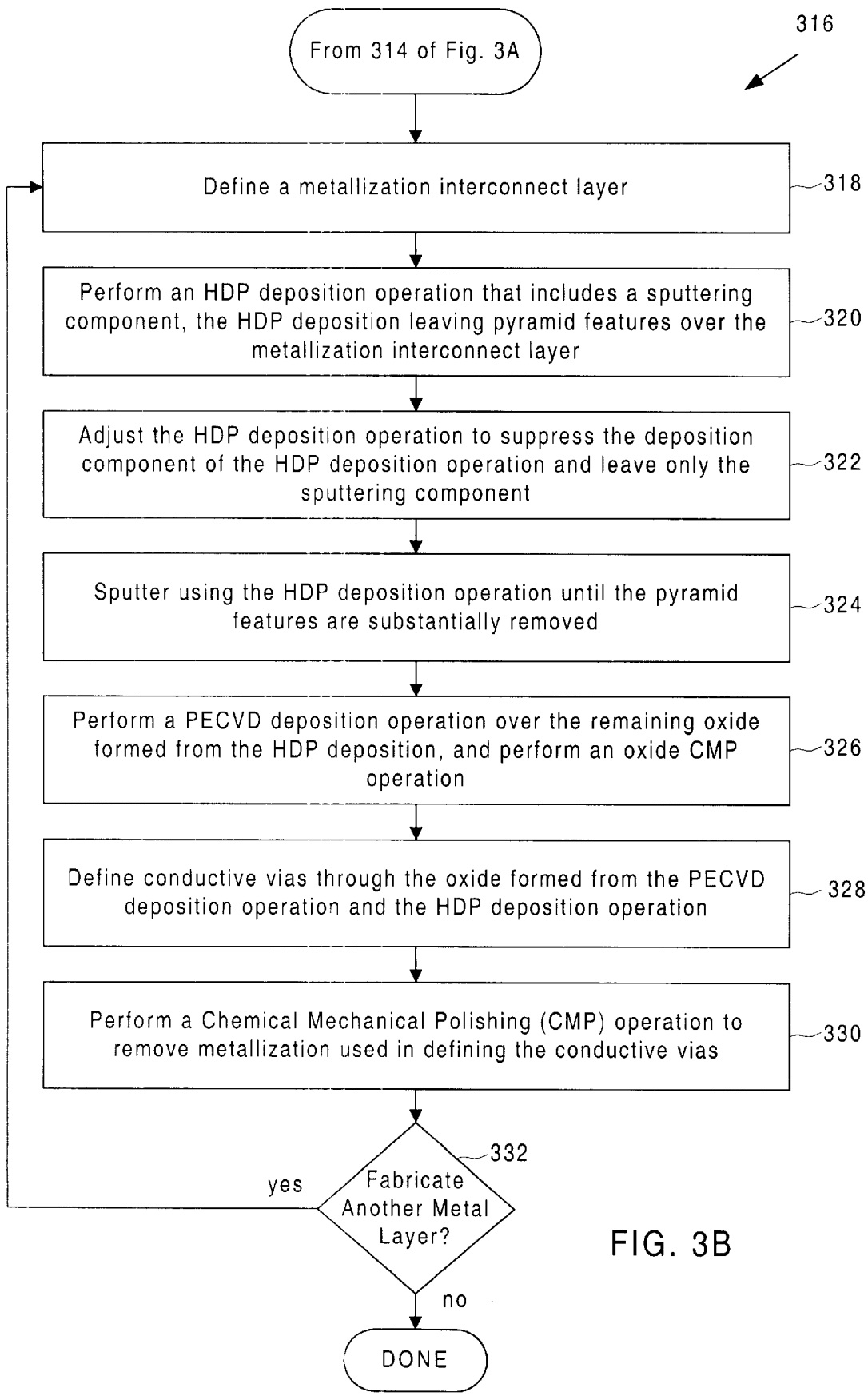
FIG. 3B shows a continuation of the method operations of FIG. 3A for subsequent HDP oxide layers, in accordance with one embodiment of the present invention.

FIGS. 3A and 3B illustrate exemplary method operations that can be implemented to carry out the formation of highly reliable inter-metal oxide in semiconductor devices.

FIG. 3A illustrates the method operations implemented to form reliable HDP oxide over a layer of patterned polysilicon, in accordance with one embodiment of the present invention. The method 300 begins at an operation 302, where a substrate is provided having patterned polysilicon gate features. The method then proceeds to an operation 304 where an HDP deposition operation is performed that includes a sputtering component, the HDP deposition leaving pyramid features over the patterned polysilicon gate features. It is desired that the oxide pyramids be substantially removed to avoid the formation of the seams, which were discussed with reference to FIGS. 1A through 1D. To achieve this goal, the method proceeds to operation 306 where the HDP gases are adjusted to suppress the deposition component of the HDP deposition operation and leave only the sputtering component. In other words, the HDP deposition gas is closed after the first HDP oxide is formed to a desired thickness and the gaps (which may have high aspect ratios) between the patterned polysilicon gate features are filled. As indicated in the next operation 308, the HDP operation sputters until the pyramid features are substantially removed.

The method then proceeds to operation 310 where a PECVD deposition operation is performed over the remaining oxide formed from the HDP deposition. The PECVD deposition operation is performed after the HDP sputter is performed, which substantially removes the oxide pyramids thus leaving suppressed oxide pyramids. After the PECVD oxide is deposited, the wafer is placed through an oxide CMP operation, which is used to planarize the top surface of the PECVD oxide. The method proceeds to operation 312 where conductive contacts are defined through the oxide formed from the PECVD deposition operation and the HDP deposition operation. In other words, contact holes are etched down to the surface of the polysilicon gates features and filled with conductive material to establish conductive contacts. The contact holes are preferably coated with Ti/TiN layers, and filled with a W layer. Other suitable conductive contact materials may also be used.

Next, the method proceeds to operation 314 where a tungsten CMP operation is performed to remove metallization used in defining the conductive contacts. The method then proceeds to operation 316 where additional interconnect metallization layers are fabricated over the top surface of the PECVD oxide. The interconnect metallization layers are fabricated using metal deposition or sputtering, photolithography and etching techniques, thus, completing the first iteration of the method operations.

This process of performing the HDP deposition and sputter operation and then closing the deposition component may be repeated for subsequent HDP oxide layers, as will be discussed with reference to FIGS. 3B.

FIG. 3B shows a continuation of the method operations of FIG. 3A for subsequent HDP oxide layers, in accordance with one embodiment of the invention. The method operation 316 continues with operation 318 where a metallization interconnect layer is defined. The method proceeds to operation 320 where an HDP deposition operation is performed that includes a sputtering component, the HDP deposition leaving pyramid features over the metallization interconnect layer. As mentioned above, it is desired that the oxide pyramids be substantially removed to avoid the formation of the seams 18. To achieve this goal, the method proceeds to operation 322 where the HDP deposition operation is adjusted to suppress the deposition component of the HDP deposition operation and leave only the sputtering component. In other words, the HDP deposition gas is closed after the first HDP oxide is formed to a desired thickness and the gaps between the patterned polysilicon gate features are filled. As indicated in the next operation 324, the HDP operation sputters until the pyramid features are substantially removed (e.g., leaving suppressed oxide pyramids).

The method proceeds to operation 326 where a PECVD deposition operation is performed over the remaining oxide formed by the HDP deposition. After the PECVD oxide is deposited, the wafer is placed through an oxide CMP operation, which is used to planarize the top surface of the PECVD oxide. The method then proceeds to operation 328 where conductive vias are defined through the oxide formed by the PECVD deposition operation and the HDP deposition operation. In other words, via holes are etched down to the surface of the metallization interconnect features and filled with conductive material to establish conductive vias. The vias holes are preferably coated with Ti/TiN layers, and filled with a W layer.

The method proceeds to operation 330 where a tungsten CMP operation is performed to remove metallization used in defining the conductive vias. The method now moves to a decision operation 332, where it is determined if there is a desire to fabricate another metal layer. If it is determined that another metal layer is to be fabricated, the method proceeds by looping back to operation 318 where another metallization interconnect layer is defined. This method will therefore be repeated until it is determined that no additional metal layers are to be fabricated. At that point, the method will end.

Figure 4A:
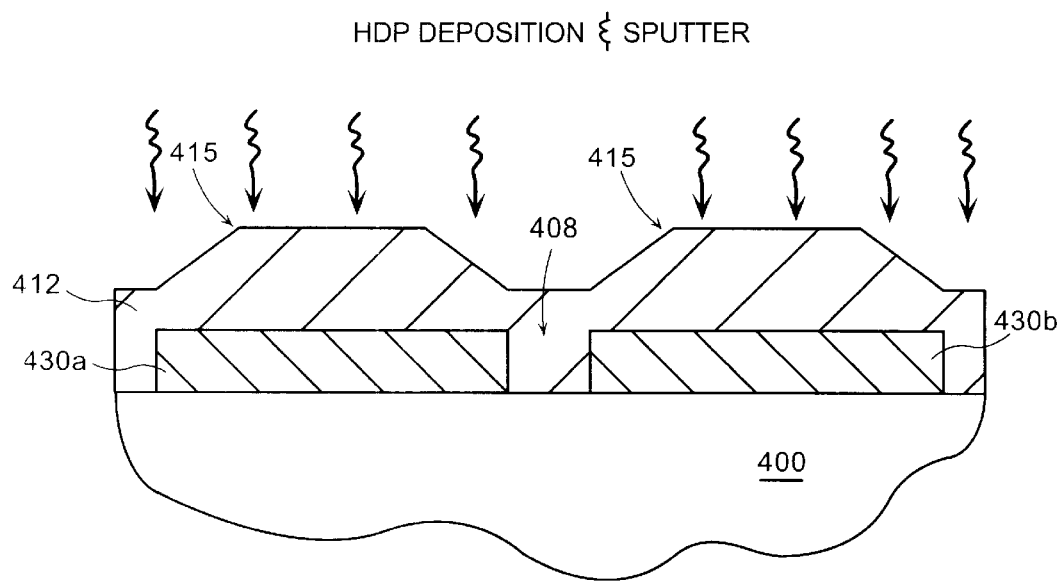
FIG. 4A shows a cross-sectional view of an integrated circuit chip fabrication process after an HDP deposition and sputter operation is performed.
Figure 4B:
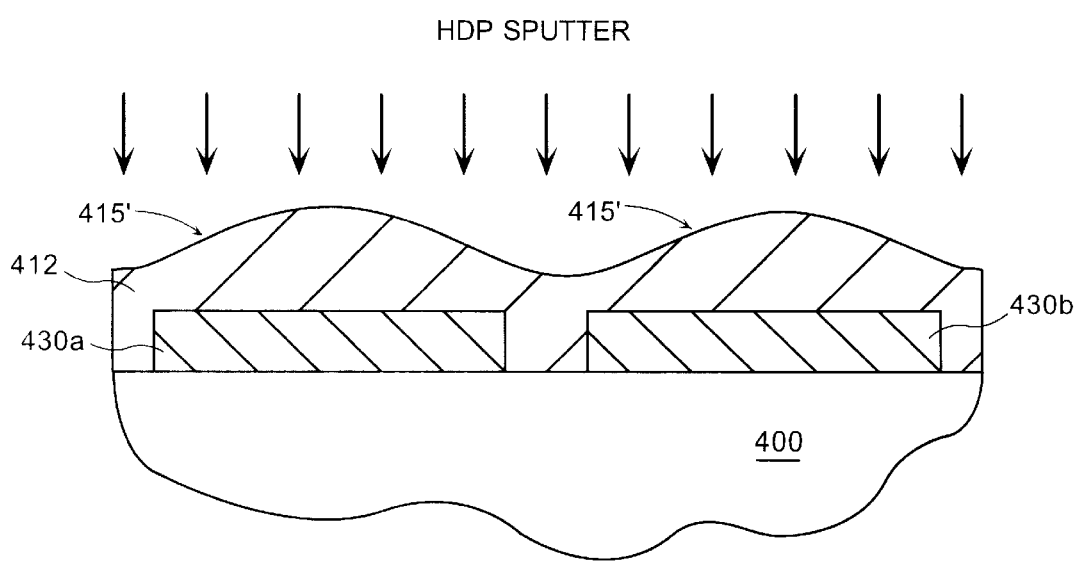
FIG. 4B shows a cross-sectional view of the integrated circuit chip fabrication process of FIG. 4A after the HDP deposition gas has been closed for a period of time, in accordance with one embodiment of the present invention.

FIGS. 4A and 4B show a cross-sectional views of an integrated circuit chip fabrication process after an HDP deposition and sputter operation is performed, in accordance with another embodiment of the invention.

FIG. 4A shows patterned conductive features 430a and 430b, which may be fabricated over any layer of a semiconductor substrate 400. The patterned conductive features 430 are typically metal lines. Here, the patterned conductive features 430 are substantially wider than the patterned metallization features 130 of FIG. 2C. An HDP oxide 412 is used to fill the gap 408 between the patterned conductive features 430. Although the HDP oxide 412 works well in filling the gap 408, the HDP operation itself causes the formation of elongated oxide pyramids 415 over the patterned conductive features 430. The elongated oxide pyramids 415 are elongated because the top surface of the patterned conductive features 430 are relatively wide, for example, as compared to the patterned metallization features 130 of FIG. 2C. The elongated oxide pyramids 415 are thereby less pointed than the oxide pyramids 115 of FIG. 2C. Although the elongated oxide pyramids 415 are less pointed, however, unintended low density oxide seams may nevertheless form during the deposition of a PECVD oxide layer. To prevent the formation of low density oxide seams, the process of performing an HDP deposition and sputter operation and then closing the deposition component is carried out to reduce the definition of the elongated oxide pyramids 415.

FIG. 4B shows a cross-sectional view of the integrated circuit chip fabrication process of FIG. 4A after the HDP deposition gas has been closed for a period of time. As described above, the HDP operation is preferably run with only the sputtering component in order to substantially smooth the elongated oxide pyramids 415 over the patterned conductive features 430. The smoothed elongated oxide pyramids 415' are sufficiently smooth such that low density oxide seams will not form during a subsequent PECVD operation.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for fabricating inter-metal oxide in semiconductor devices, comprising:
    providing a semiconductor substrate having a plurality of patterned conductive features;
    performing a high density plasma (HDP) operation that is configured to deposit an oxide layer over the plurality of patterned conductive features, the HDP operation including a deposition component and a sputtering component, the deposition component being driven by a deposition gas and the sputtering component being driven by a sputtering gas, and the HDP operation forming oxide pyramids over the plurality of patterned conductive features;
    closing the deposition gas to remove the deposition component from the HDP operation; and
    running the HDP operation with the sputtering gas to retain the sputtering component, the sputtering component being configured to substantially remove the oxide pyramids from over the plurality of patterned conductive features.

2. A method for fabricating inter-metal oxide in semiconductor devices as recited in claim 1, wherein the plurality of patterned conductive features are one of patterned metallization features and patterned polysilicon features.

3. A method for fabricating inter-metal oxide in semiconductor devices as recited in claim 1, wherein the HDP operation is performed in a process chamber.

4. A method for fabricating inter-metal oxide in semiconductor devices as recited in claim 1, wherein the oxide layer is a silicon dioxide ($SiO_2$) layer.

5. A method for fabricating inter-metal oxide in semiconductor devices as recited in claim 3, wherein the deposition gas of the deposition component includes a silane gas and an oxygen gas, the method further comprises:
    introducing the silane gas into the process chamber at a flow rate of about 75 standard cubic centimeters per minute (sccm); and
    introducing the oxygen gas into the process chamber at a flow rate of between about 120 sccm and 180 sccm.

6. A method for fabricating inter-metal oxide in semiconductor devices as recited in claim 3, wherein the sputtering gas of the sputtering component includes an argon gas, the method further comprising:
    introducing the argon gas into the process chamber at a flow rate ranging between about 100 sccm and about 120 sccm.

7. A method for fabricating inter-metal oxide in semiconductor devices as recited in claim 6, further comprising:
    maintaining a power level for the sputtering component, the maintaining includes,
        setting a bottom power of the process chamber to range between about 500 watts and about 4,500 watts;
        setting a top power of the process chamber to range between about 600 watts and about 2,000 watts; and
        setting a side power of the process chamber to range between about 1,000 and about 4,500 watts.

8. A method for fabricating inter-metal oxide in semiconductor devices as recited in claim 6, further comprising:
    maintaining a pressure level for the sputtering component, the maintaining includes,
        setting a pressure for the process chamber to range between about 3 mTorr and about 10 mTorr.

9. A method for fabricating inter-metal oxide in semiconductor devices as recited in claim 1, wherein when the oxide pyramid have a vertical height ranging between about 500 angstroms and about 2,500 angstroms, the method further comprises:
    continuing the running of the HDP operation for a period of time ranging between about 10 seconds and about 45 seconds.

10. A method for fabricating inter-metal oxide in semiconductor devices as recited in claim 1, further comprising:
    depositing a PECVD oxide over the oxide layer deposited by the HDP operation after the sputtering component of the HDP operation substantially removes the oxide pyramids from over the plurality of patterned conductive features.

11. A method for fabricating inter-metal oxide in semiconductor integrated circuit devices, comprising:
    providing a semiconductor substrate having a plurality of patterned conductive features, some of the patterned conductive features defining high aspect ratio gaps;
    starting a high density plasma (HDP) operation that is configured to deposit an oxide layer over the plurality of patterned conductive features and in the high aspect ratio gaps, the HDP operation including a deposition component and a sputtering component, the deposition component being driven by a deposition gas and the sputtering component being driven by a sputtering gas, and the HDP operation forming oxide pyramids over the plurality of patterned conductive features;
    continuing the HDP operation without the deposition gas to remove the deposition component while retaining the sputtering component; and
    completing the HDP operation when the oxide pyramids are substantially smoothed.

12. A method for fabricating inter-metal oxide in semiconductor integrated circuit devices as recited in claim 11, wherein the plurality of patterned conductive features are one of patterned metallization features and patterned polysilicon features.

13. A method for fabricating inter-metal oxide in semiconductor integrated circuit devices as recited in claim 11, wherein the HDP operation is performed in a process chamber.

14. A method for fabricating inter-metal oxide in semiconductor integrated circuit devices as recited in claim 13, wherein the deposition gas of the deposition component includes a silane gas, the method further comprises:
    introducing the silane gas into the process chamber at a flow rate of about 75 standard cubic centimeters per minute (sccm); and
    introducing the oxygen gas into the process chamber at a flow rate of between about 120 sccm and 180 sccm.

15. A method for fabricating inter-metal oxide in semiconductor integrated circuit devices as recited in claim 14, wherein the sputtering gas of the sputtering component includes an argon gas, the method further comprising:

introducing the argon gas into the process chamber at a flow rate ranging between about 100 sccm and about 120 sccm.

16. A method for fabricating inter-metal oxide in semiconductor integrated circuit devices as recited in claim 14, wherein when the oxide pyramid have a vertical height ranging between about 500 angstroms and about 2,500 angstroms.

17. A method for fabricating inter-metal oxide in semiconductor integrated circuit devices as recited in claim 16, wherein the continuing is set for a period of time ranging between about 10 seconds and about 45 seconds.

18. A method for fabricating inter-metal oxide in semiconductor devices, comprising:

providing a semiconductor substrate having a plurality of patterned conductive features;

performing a high density plasma (HDP) operation that is configured to deposit an oxide layer over the plurality of patterned conductive features, the HDP operation including a deposition component and a sputtering component, the deposition component being driven by a deposition gas and the sputtering component being driven by a sputtering gas, the deposition gas including silane gas and oxygen gas, the silane gas being introduced into a process chamber at a flow rate of about 75 standard cubic centimeters per minute (sccm) and the oxygen gas being introduced into the process chamber at a flow rate of between about 120 sccm and 180 sccm, the sputtering gas including argon gas, the argon gas being introduced into the process chamber at a flow rate of between about 100 sccm and about 120 sccm, and the HDP operation forming oxide pyramids over the plurality of patterned conductive features;

closing the deposition gas to remove the deposition component from the HDP operation; and running the HDP operation with the sputtering gas to retain the sputtering component, the sputtering component being configured to substantially remove the oxide pyramids from over the plurality of patterned conductive features.

\* \* \* \* \*